(12) United States Patent
Okamoto et al.

(10) Patent No.: US 8,124,982 B2
(45) Date of Patent: Feb. 28, 2012

(54) SEMICONDUCTOR LIGHT-EMITTING ELEMENT AND METHOD FOR FABRICATION THE SAME

(75) Inventors: Kuniyoshi Okamoto, Kyoto (JP); Hiroaki Ohta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 133 days.

(21) Appl. No.: 12/451,920

(22) PCT Filed: Jun. 5, 2008

(86) PCT No.: PCT/JP2008/060385
§ 371 (c)(1),
(2), (4) Date: Apr. 20, 2010

(87) PCT Pub. No.: WO2008/149945
PCT Pub. Date: Dec. 11, 2008

(65) Prior Publication Data
US 2010/0295054 A1 Nov. 25, 2010

(30) Foreign Application Priority Data
Jun. 8, 2007 (JP) ................... 2007-153045

(51) Int. Cl.
*H01L 33/02* (2010.01)
*H01L 33/16* (2010.01)

(52) U.S. Cl. ............... 257/76; 438/46; 257/E33.005

(58) Field of Classification Search ............ 257/76, 257/103, 79, E33.023, E33.025, E33.003; 438/46
See application file for complete search history.

(56) References Cited

U.S. PATENT DOCUMENTS

| 2004/0238810 A1 | 12/2004 | Dwilinski et al. |
| 2004/0251471 A1 | 12/2004 | Dwilinski et al. |
| 2004/0261692 A1 | 12/2004 | Dwilinski et al. |
| 2005/0242357 A1 | 11/2005 | Uematsu et al. |
| 2005/0249255 A1 | 11/2005 | Dwilinski et al. |
| 2006/0032428 A1 | 2/2006 | Dwilinski et al. |
| 2006/0175618 A1* | 8/2006 | Ishida ............ 257/79 |
| 2007/0040240 A1 | 2/2007 | Dwilinski et al. |

FOREIGN PATENT DOCUMENTS

| JP | 2001-217506 A | 8/2001 |
| JP | 2005-531154 | 10/2005 |
| JP | 2005-340765 A | 12/2005 |
| JP | 2006-245564 A | 9/2006 |
| JP | 2007-129042 A | 5/2007 |

OTHER PUBLICATIONS

Hisashi Yamada et al., "Impact of Substrate Miscut on the Characteristic of m-plane InGaN/GaN Light Emitting Diodes", Japanese Journal of Applied Physics, Nov. 22, 2007, vol. 46, No. 46, pp. L1117-L1119.

* cited by examiner

*Primary Examiner* — Evan Pert
*Assistant Examiner* — Selim Ahmed
(74) *Attorney, Agent, or Firm* — Rabin & Berdo, Jr.

(57) ABSTRACT

The semiconductor light-emitting element includes a group III nitride semiconductor multilayer structure having an active layer containing In as well as a p-type layer and an n-type layer stacked to hold the active layer therebetween. The group III nitride semiconductor multilayer structure is made of a group III nitride semiconductor having a major surface defined by a nonpolar plane whose offset angle in a c-axis direction is negative. A remarkable effect is attained when the emission wavelength of the active layer is not less than 450 nm. In the group III nitride semiconductor constituting the group III nitride semiconductor multilayer structure, the offset angle $\theta$ in the c-axis direction preferably satisfies $-1° < \theta < 0°$.

9 Claims, 7 Drawing Sheets

SEMICONDUCTOR LIGHT-EMITTING ELEMENT AND METHOD FOR FABRICATION THE SAME

TECHNICAL FIELD

The present invention relates to a semiconductor light-emitting element such as a light-emitting diode or a laser diode and a method for fabricating the same.

BACKGROUND ART

A semiconductor employing nitrogen as a group V element in a group III-V semiconductor is referred to as a "group III nitride semiconductor", and typical examples thereof are aluminum nitride (AlN), gallium nitride (GaN) and indium nitride (InN). The group III nitride semiconductor can be generally expressed as $Al_xIn_yGa_{1-x-y}N$ ($0 \leq x \leq 1$, $0 \leq y \leq 1$ and $0 \leq x+y \leq 1$).

A method for fabricating a nitride semiconductor by growing a group III nitride semiconductor on a gallium nitride (GaN) substrate having a major surface defined by a c-plane by metal organic chemical vapor deposition (MOCVD) is known. A group III nitride semiconductor multilayer structure having an n-type layer and a p-type layer as well as an active layer (a light emitting layer) held therebetween can be formed by applying the method, and a light-emitting device utilizing the multilayer structure can be prepared. Such a light-emitting device can be utilized as the light source of a backlight for a liquid crystal panel, for example.

The major surface of the group III nitride semiconductor regrown on the GaN substrate having the major surface defined by a c-plane is also defined by a c-plane. Light extracted from the c-plane is in a random polarization (nonpolarization) state. When the light is incident on the liquid crystal panel, therefore, light other than specific polarized light corresponding to a polarizing plate on an incidence side is blocked, and does not contribute to brightness to an outgoing side. Therefore, bright display is disadvantageously hard to implement (efficiency is 50% at the maximum).

In order to solve the problem, a technique of preparing a light-emitting device by growing a group III nitride semiconductor having a major surface defined by a plane other than a c-plane, i.e., a nonpolar plane such as an a-plane or an m-plane or a semipolar plane is examined. When a light-emitting device having a p-type layer and an n-type layer is formed by a group III nitride semiconductor layer having a major surface defined by a nonpolar plane or a semipolar plane, light of a strong polarization state can be emitted. Therefore, loss in the polarizing plate on the incidence side can be reduced by matching the direction of polarization of such a light-emitting device and the direction of passage polarization of the polarizing plate on the incidence side of the liquid crystal panel. Consequently, bright display can be implemented.

Patent Document 1: Japanese Unexamined Patent Publication No. 2007-129042

DISCLOSURE OF THE INVENTION

Problems to be Solved

In order to implement light emission in the long wave range of not less than 450 nm, the In (indium) composition in the active layer must be increased. While the In composition must be set to about 15% in order to set the emission wavelength to 450 nm, for example, the active layer must be grown at a low temperature of about 750° C. in this case. However, the growth temperature for the p-type layer grown after the active layer is about 1000° C. Therefore, the active layer is thermally damaged due to the temperature for growing the p-type layer, and hence desired luminous efficiency cannot be obtained.

On the other hand, the inventors of this application have proposed a semiconductor laser constituted of a group III nitride semiconductor multilayer structure having a major growth surface defined by a nonpolar plane such as an m-plane in precedently submitted Japanese Patent Application No. 2007-040074. A semiconductor laser having excellent luminous efficiency and a low threshold can be implemented according to the structure.

In the semiconductor laser, however, a problem similar to that in the aforementioned case arises when it is attempted to implement light emission in the long wave range of not less than 450 nm. In order to implement a semiconductor laser excellent in oscillation efficiency in the long wave range, therefore, problems have still been left.

The problem of the thermal damage on the active layer similarly applies to a semiconductor light-emitting element in a wave range of less than 450 nm to a greater or lesser degree. In other words, In atoms must be incorporated by growing an active layer at a low temperature, and hence the active layer is thermally damaged in subsequent high-temperature growth of an n-type layer or a p-type layer.

Accordingly, an object of the present invention is to provide a semiconductor light-emitting element capable of implementing excellent luminous efficiency by suppressing thermal damage on an active layer and a method for fabricating the same.

Solutions to the Problems

The semiconductor light-emitting element according to the present invention includes a group III nitride semiconductor multilayer structure having an active layer (an active layer made of AlInGaN) containing In as well as a p-type layer and an n-type layer stacked to hold the active layer therebetween. The group III nitride semiconductor multilayer structure is made of a group III nitride semiconductor having a major surface defined by a nonpolar plane whose offset angle in a c-axis direction is negative.

A group III nitride semiconductor has a hexagonal crystal structure, and four nitrogen atoms are bonded to one group III atom. The four nitrogen atoms are located on four vertices of a regular tetrahedron having the group III atom disposed at the center thereof. In the four nitrogen atoms, one nitrogen atom is located in a +c-axis direction with respect to the group III atom, while the remaining three nitrogen atoms are located on a −c-axis side with respect to the group III atom. When a crystal of a group III nitride semiconductor is cleaved along two surfaces parallel to the c-plane, the surface on the +c-axis side (a +c-plane) is defined by a crystal plane where group III atoms align, and the surface on the −c-axis side (a −c-plane) is defined by a crystal plane (a nitrogen plane) where nitrogen atoms align. Therefore, the +c-plane and the −c-plane are different crystal planes, and exhibit different physical properties. More specifically, it has been recognized that the +c-plane has high durability against chemical reactivity such as high resistance against alkali, while the −c-plane is chemically weak and dissolved in alkali, for example.

Thus, the c-planes have different physical properties on the +c-axis side and the −c-axis side. Due to the difference between the physical properties, polarization along the c-axis direction is caused in the group III nitride semiconductor. Therefore, the c-planes are referred to as polar planes.

An m-plane and an a-plane are perpendicular to the c-planes and cause no polarization along the m-axis direction and the a-axis direction, and hence these planes are referred to as nonpolar planes.

According to the present invention, the group III nitride semiconductor constituting the group III nitride semiconductor multilayer structure has the major surface defined by a nonpolar plane (an m-plane or an a-plane), and the offset angle of the nonpolar plane in the c-axis direction is negative. The offset angle is an angle of inclination from a just plane. In other words, assuming that the normal direction of the just plane is a reference direction (them-axis direction or the a-axis direction), an angle formed by the normal direction of the major surface of the group III nitride semiconductor and the reference direction is the offset angle. When the offset angle in the c-axis direction is considered, a virtual plane (a plane parallel to the a-plane or them-plane) including the reference direction and the c-axis direction is considered, and the normal direction of the major surface of the group III nitride semiconductor is projected on the virtual plane to consider an orthogonal projection of the normal direction. An angle formed by the orthogonal projection and the reference direction is the offset angle in the c-axis direction. In this case, it is expressed as "having a positive offset angle in the c-axis direction" or the like when the orthogonal projection of the normal direction is inclined toward the +c-axis side with respect to the reference direction. On the contrary, it is expressed as "whose offset angle in a c-axis direction is negative" or the like when the orthogonal projection of the normal direction is inclined toward the −c-axis side with respect to the reference direction.

Small steps of an atomic level are formed on the major surface of a group III nitride semiconductor defined by a nonpolar plane having a significant offset angle. In the case of a nonpolar plane having an offset angle in the −c-axis direction, a −c-plane (a nitrogen plane) is exposed on the steps. In crystal growth of the group III nitride semiconductor, therefore, crystal growth in the thickness direction (the normal direction of the major surface) progresses while crystal growth (two-dimensional growth) filmily progresses in the −c-plane direction. As hereinabove described, the −c-plane side is chemically instable, and hence easily incorporates impurities in crystal growth. Thus, In atoms as the impurities are easily incorporated when the group III nitride semiconductor is crystal-grown. Therefore, a group III nitride semiconductor having a high In composition can be grown even under such a high-temperature condition (not less than 750° C., for example) that In atoms are relatively hard to incorporate.

Thus, the active layer containing In can be grown under a high-temperature condition (an active layer having a higher In composition can be grown at the same temperature), whereby the active layer is resistant to thermal difference damage. In other words, the difference between the growth temperature for the active layer and the growth temperature for the p-type layer or the n-type layer is small, and characteristic deterioration of the active layer resulting from thermal influence can be suppressed. Consequently, a semiconductor light-emitting element having high luminous efficiency can be implemented.

The major surface of the group III nitride semiconductor multilayer structure is defined by the nonpolar plane not causing spontaneous polarization or piezoelectric polarization, whereby, when the group III nitride semiconductor multilayer structure is constituted of multiple quantum well layers, separation of carriers resulting from spontaneous piezoelectric polarization in quantum wells is suppressed. Thus, internal quantum efficiency exceeding that in a case of employing a group III nitride semiconductor having a major surface defined by a c-plane can be implemented, whereby the luminous efficiency can be improved.

When the emission wavelength of the active layer is not less than 450 nm, the effects of the present invention are increased. When the emission wavelength is not less than 450 nm (not less than 450 nm and not more than 550 nm, for example: more specifically, 500 nm, for example), the In composition in the active layer must be set to not less than 15% (not less than 15% and not more than 25%, for example: when the emission wavelength is 500 nm, 20%, for example), for example. The active layer having such a high In composition can be grown under a condition of a relatively high temperature (not less than 750° C., for example) by applying the present invention. Also in the wave range of not less than 450 nm, therefore, a semiconductor light-emitting element having high luminous efficiency can be implemented by suppressing thermal damage on the active layer.

In the group III nitride semiconductor forming the group III nitride semiconductor multilayer structure, the offset angle $\theta$ in the c-axis direction preferably satisfies $-1°<\theta<0°$. A nonpolar plane having an offset angle in such a range is so employed that the group III nitride semiconductor multilayer structure can have an excellent crystal structure with a small number of defects. Consequently, the luminous efficiency can be further improved.

The method of fabricating a semiconductor element according to the present invention is a method of fabricating a semiconductor light-emitting element including a group III nitride semiconductor multilayer structure having an active layer containing In as well as a p-type layer and an n-type layer stacked to hold the active layer therebetween. The method includes a step of forming the group III nitride semiconductor multilayer structure by growing a group III nitride semiconductor with a major surface defined by a nonpolar plane whose offset angle in a c-axis direction is negative.

According to the method, the active layer containing In can be grown under a condition of a relatively high temperature, whereby thermal damage on the active layer can be reduced. Consequently, a semiconductor light-emitting element having excellent luminous efficiency can be implemented.

When the emission wavelength of the active layer is not less than 450 nm, the effects of the present invention are increased. While the In composition in the active layer must be increased for light emission in the wave range of not less than 450 nm, an active layer having a high In composition can also be formed under a temperature condition of a relatively high temperature according to the present invention. Thus, a semiconductor light-emitting element having excellent luminous efficiency can be implemented also in the wave range of not less than 450 nm.

The major surface is preferably defined by an m-plane whose offset angle in the c-axis direction is negative. Crystallinity can be improved by employing the m-plane as the major surface for crystal growth. Thus, a semiconductor light-emitting element of higher performance can be implemented.

The step of forming the group III nitride semiconductor multilayer structure preferably includes a step of growing a group III nitride semiconductor having a major surface defined by a nonpolar plane whose offset angle $\theta$ in the c-axis direction satisfies $-1°<\theta<0°$. A planar group III nitride semiconductor multilayer structure can be formed by setting the range of the offset angle $\theta$ to $-1°<\theta<0°$. Thus, the luminous efficiency of the semiconductor light-emitting element can be further improved.

The step of forming the group III nitride semiconductor multilayer structure preferably includes a step of growing the group III nitride semiconductor on a group III nitride semiconductor single-crystalline substrate having a major surface whose offset angle in the c-axis direction is negative. According to the method, the group III nitride semiconductor multilayer structure is grown on the group III nitride semiconductor single-crystalline substrate, whereby a group III nitride semiconductor multilayer structure having excellent crystallinity with a small number of defects can be formed. Thus, a semiconductor light-emitting element further improved in luminous efficiency can be obtained.

The group III nitride semiconductor single-crystalline substrate is preferably a GaN substrate. By using such a GaN substrate, the group III nitride semiconductor multilayer structure becomes a high-quality crystal having a small number of defects. Thus, a semiconductor light-emitting element of higher performance can be implemented.

The foregoing and other objects, features and effects of the present invention will become more apparent from the following detailed description of the embodiments with reference to the attached drawings.

DESCRIPTION OF THE REFERENCE NUMERALS

1 substrate (GaN single-crystalline substrate), 1A normal direction of major surface, 2 group III nitride semiconductor multilayer structure, 3 n-side electrode, 4 p-side electrode, 6 insulating layer, 10 light emitting layer, 11 n-type semiconductor layer, 12 p-type semiconductor layer, 13 n-type GaN contact layer, 14 n-type AlGaN cladding layer, 15 n-type GaN guide layer, 16 p-type AlGaN electron blocking layer, 17 p-type GaN guide layer, 18 p-type AlGaN cladding layer, 19 p-type GaN contact layer, 20 ridge stripe, 21 end face, 22 end face, 23 insulating film, 24 insulating film, 26 n-type InGaN layer, 30 treating chamber, 31 heater, 32 susceptor, 33 rotating shaft, 34 rotational driving mechanism, 35 substrate, 36 exhaust pipe, 40 source gas introduction passage, 41 nitrogen material pipe, 42 gallium material pipe, 43 aluminum material pipe, 44 indium material pipe, 45 magnesium material pipe, 46 silicon material pipe, 51 nitrogen material valve, 52 gallium material valve, 53 aluminum material valve, 54 indium material valve, 55 magnesium material valve, 56 silicon material valve, 70 semiconductor laser diode, 80 semiconductor laser diode, 90 semiconductor laser diode, 100 step (nitrogen plane)

BEST MODE FOR CARRYING OUT THE INVENTION

Figure 1:
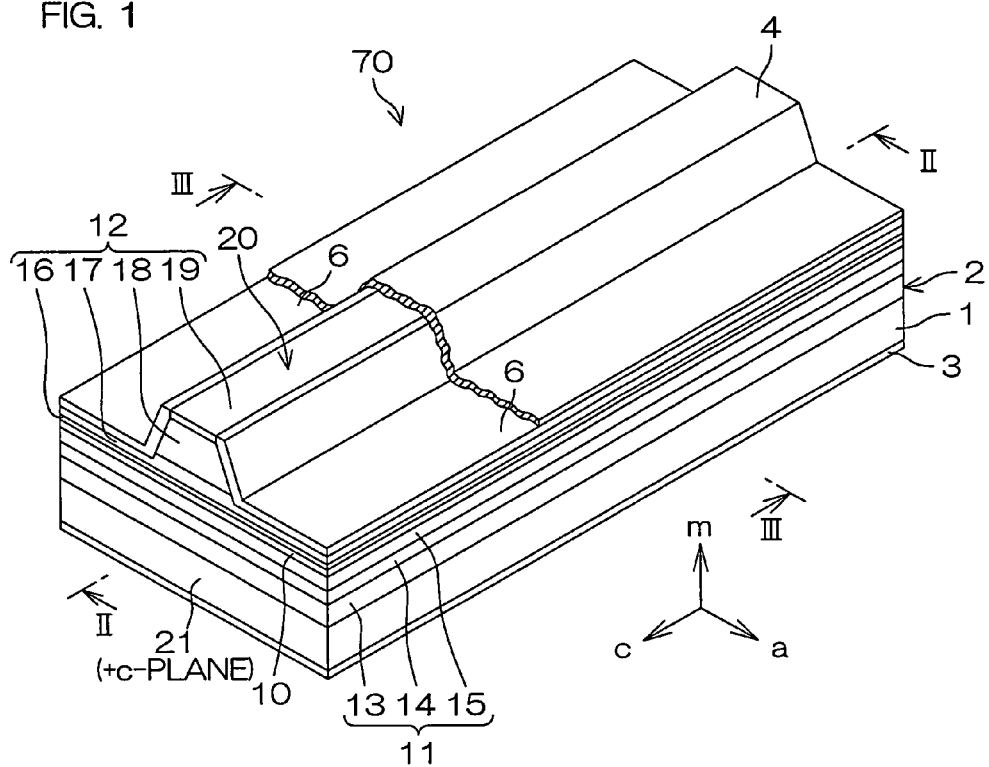
FIG. 1 is a perspective view for illustrating the structure of a semiconductor laser diode according to a first embodiment of the present invention.
Figure 2:
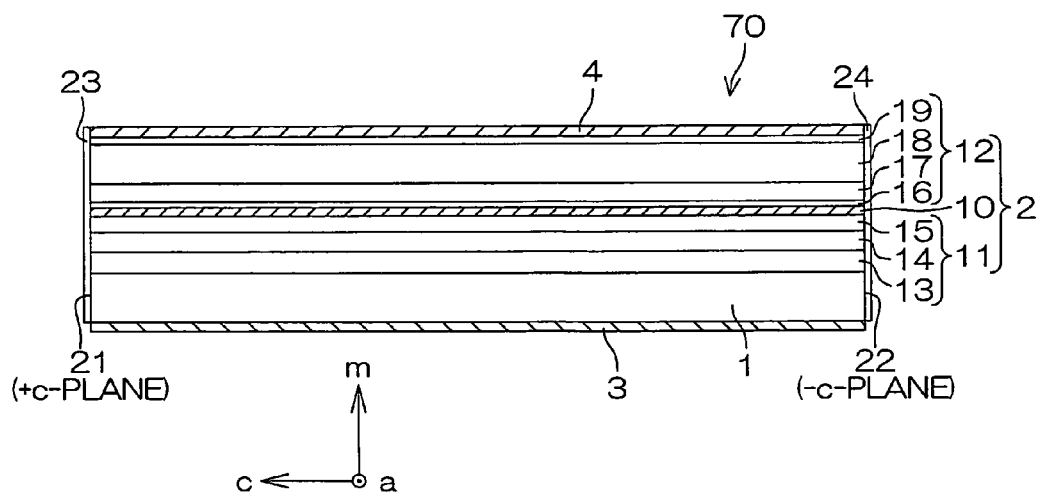
FIG. 2 is a longitudinal sectional view along a line II-II in FIG. 1.
Figure 3:
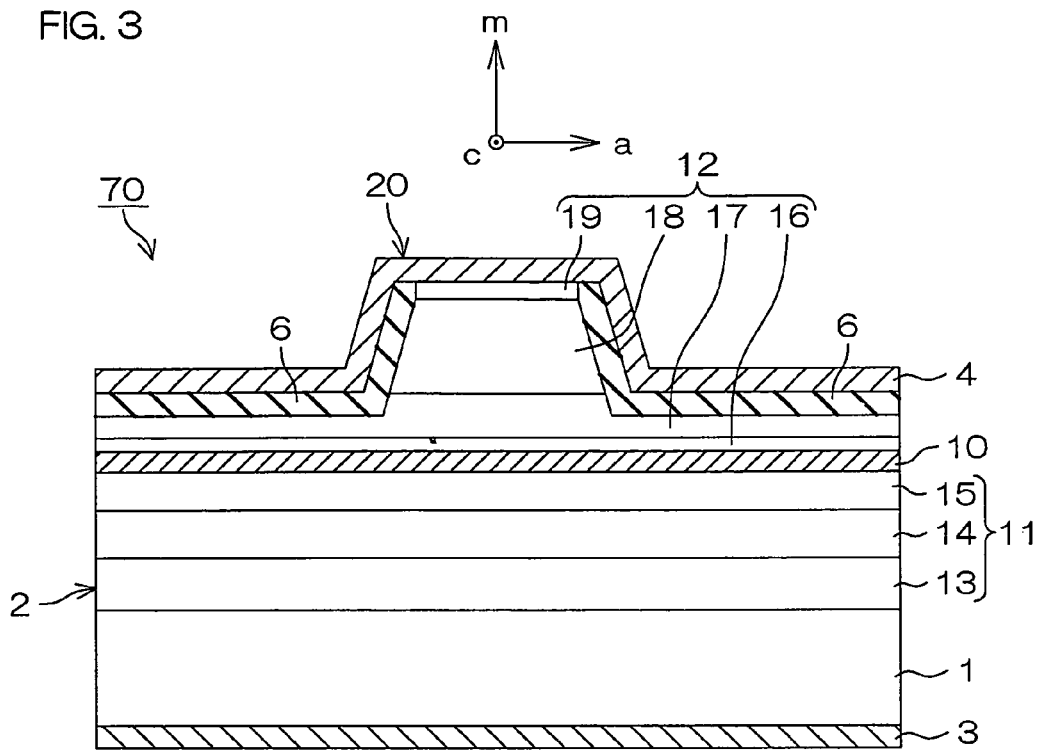
FIG. 3 is a cross sectional view along a line III-III in FIG. 1.

FIG. 1 is a perspective view for illustrating the structure of a semiconductor laser diode according to an embodiment of the present invention, FIG. 2 is a longitudinal sectional view along a line II-II in FIG. 1, and FIG. 3 is a cross sectional view along a line in FIG. 1.

A semiconductor laser diode 70 is a Fabry-Perot laser diode including a substrate 1, a group III nitride semiconductor multilayer structure 2 formed on the substrate 1 by crystal growth, an n-side electrode 3 formed in contact with the rear surface (the surface opposite to the group III nitride semiconductor multilayer structure 2) of the substrate 1 and a p-side electrode 4 formed in contact with the surface of the group III nitride semiconductor multilayer structure 2.

The substrate 1 is constituted of a GaN single-crystalline substrate in this embodiment. The substrate 1 has a major surface defined by an m-plane which is an example of a nonpolar plane, and the group III nitride semiconductor multilayer structure 2 is formed by crystal growth on the major surface. Therefore, the group III nitride semiconductor multilayer structure 2 is made of group III nitride semiconductors having major crystal growth surfaces defined by m-planes.

The group III nitride semiconductor multilayer structure 2 includes a light emitting layer (an active layer) 10, an n-type semiconductor layer 11 and a p-type semiconductor layer 12. The n-type semiconductor layer 11 is disposed on a side of the light emitting layer 10 closer to the substrate 1, while the p-type semiconductor layer 12 is disposed on a side of the light emitting layer 10 closer to the p-side electrode 4. Thus, the light emitting layer 10 is held between the n-type semiconductor layer 11 and the p-type semiconductor layer 12, and a double heterojunction is provided. Electrons and positive holes are injected into the light emitting layer 10 from the n-type semiconductor layer 11 and the p-type semiconductor layer 12 respectively. The electrons and the positive holes are recombined in the light emitting layer 10, to emit light.

The n-type semiconductor layer 11 is formed by successively stacking an n-type GaN contact layer 13 (having a thickness of 2 μm, for example), an n-type AlGaN cladding layer 14 (having a thickness of not more than 1.5 μm such as a thickness of 1.0 μm, for example) and an n-type GaN guide layer 15 (having a thickness of 0.1 μm, for example) from the side closer to the substrate 1. On the other hand, the p-type semiconductor layer 12 is formed by successively stacking a p-type AlGaN electron blocking layer 16 (having a thickness of 20 nm, for example), a p-type GaN guide layer 17 (having a thickness of 0.1 μm, for example), a p-type AlGaN cladding layer 18 (having a thickness of not more than 1.5 μm such as a thickness of 0.4 μm, for example) and a p-type GaN contact layer 19 (having a thickness of 0.3 μm, for example) on the light emitting layer 10.

The n-type GaN contact layer 13 is a low-resistance layer. The p-type GaN contact layer 19 is a low-resistance layer for attaining ohmic contact with the p-side electrode 4. The n-type GaN contact layer 13 is made of an n-type semiconductor prepared by doping GaN with Si, for example, serving as an n-type dopant in a high concentration (the doping concentration is $3\times10^{18}$ cm$^{-3}$, for example). The p-type GaN contact layer 19 is formed by a p-type semiconductor layer prepared by doping GaN with Mg, for example, serving as a p-type dopant in a high concentration (the doping concentration is $3\times10^{19}$ cm$^{-3}$, for example).

The n-type AlGaN cladding layer 14 and the p-type AlGaN cladding layer 18 provide a light confining effect confining the light from the light emitting layer 10 therebetween. The n-type AlGaN cladding layer 14 is made of an n-type semiconductor prepared by doping AlGaN with Si, for example, serving as an n-type dopant (the doping concentration is $1\times10^{18}$ cm$^{-3}$, for example). The p-type AlGaN cladding layer 18 is formed by a p-type semiconductor layer prepared by doping AlGaN with Mg serving as a p-type dopant (the doping concentration is $1\times10^{19}$ cm$^{-3}$, for example). The band gap of the n-type AlGaN cladding layer 14 is wider than that of the n-type GaN guide layer 15, and the band gap of the p-type AlGaN cladding layer 18 is wider than that of the p-type GaN guide layer 17. Thus, the light can be excellently confined, and a semiconductor laser diode having a low threshold and high efficiency can be implemented.

The n-type GaN guide layer 15 and the p-type GaN guide layer 17 are semiconductor layers providing a carrier confining effect for confining carriers (the electrons and the positive holes) in the light emitting layer 10. Thus, the efficiency of recombination of the electrons and the positive holes in the light emitting layer 10 is improved. The n-type GaN guide layer 15 is made of an n-type semiconductor prepared by doping GaN with Si, for example, serving as an n-type dopant (the doping concentration is $1\times10^{18}$ cm$^{-3}$, for example), and the p-type GaN guide layer 17 is made of a p-type semiconductor prepared by doping GaN with Mg, for example, serving as a p-type dopant (the doping concentration is $5\times10^{18}$ cm$^{-3}$, for example).

The p-type AlGaN electron blocking layer 16 is a p-type semiconductor formed by doping AlGaN with Mg, for example, serving as a p-type dopant (the doping concentration is $5\times10^{18}$ cm$^{-3}$, for example), and improves the efficiency of recombination of the electrons and the positive holes by preventing the electrons from flowing out of the light emitting layer 10.

The light emitting layer 10, having an MQW (multiple-quantum well) structure containing InGaN, for example, is a layer for emitting light by recombination of the electrons and the positive holes and amplifying the emitted light. More specifically, the light emitting layer 10 is formed by alternately repetitively stacking InGaN layers (each having a thickness 3 nm, for example) and GaN layers (each having a thickness of 9 nm, for example) by a plurality of cycles. In this case, the composition of In in each InGaN layer is set to not less than 5%, whereby a band gap is relatively reduced and the InGaN layer constitutes a quantum well layer. On the other hand, each GaN layer functions as a barrier layer having a relatively large band gap. The InGaN layers and the GaN layers are alternately repetitively stacked by two to seven cycles, for example, to constitute the light emitting layer 10 having the MQW structure. An emission wavelength is set to 400 nm to 550 nm by adjusting the In composition in each quantum well layer (InGaN layer). In the MQW structure, the number of quantum wells containing In is preferably set to not more than 3. For example, the In composition in each quantum well layer in a case of setting the emission wavelength to not less than 450 nm is set to not less than 15%. More specifically, the In composition in a case of setting the emission wavelength to 500 nm is 18% to 22%.

The p-type semiconductor layer 12 has been partially removed, to form a ridge stripe 20. More specifically, the p-type contact layer 19, the p-type AlGaN cladding layer 18 and the p-type GaN guide layer 17 have been partially removed by etching, whereby the ridge stripe 20 having a generally trapezoidal shape (a mesa shape) in cross sectional view is formed. The ridge stripe 20 is formed along the c-axis direction.

The group III nitride semiconductor multilayer structure 2 has a pair of end faces 21 and 22 (cleavage planes) formed by cleaving both ends of the ridge stripe 20 in the longitudinal direction. The pair of end faces 21 and 22 are parallel to each other, and both are perpendicular to c-axes. Thus, a Fabry-Perot cavity having the end faces 21 and 22 as cavity end faces are formed by the n-type GaN guide layer 15, the light emitting layer 10 and the p-type GaN guide layer 17. In other words, the light generated in the light emitting layer 10 is amplified by induced emission while reciprocating between the cavity end faces 21 and 22. The amplified light is partially extracted from the cavity end faces 21 and 22 as laser beams outward from the element.

The n-side electrode 3 and the p-side electrode 4, each made of an Al metal, for example, are ohmic-connected to the substrate 1 and the p-type contact layer 19 respectively. An insulating layer 6 covering exposed surfaces of the n-type GaN guide layer 17 and the p-type AlGaN cladding layer 18 is provided, so that the p-side electrode 4 is in contact with only the p-type GaN contact layer 19 on the top face of the ridge stripe 20. Thus, a current can be concentrated on the ridge stripe 20, whereby efficient laser oscillation is enabled. In the surface of the ridge stripe 20, regions excluding the portion in contact with the p-side electrode 4 are covered with the insulating layer 6 and protected, whereby control can be simplified by loosening light confinement in the lateral direction, and leakage currents from the side surfaces can be prevented. The insulating layer 6 can be made of an insulating material such as $SiO_2$ or $ZrO_2$, for example, having a refractive index greater than 1.

Further, the top face of the ridge stripe 20 is defined by an m-plane, and the p-side electrode 4 is formed on the m-plane. The rear surface of the substrate 1 provided with the n-side electrode 3 is also defined by an m-plane. Thus, both of the p-side electrode 4 and the n-side electrode 3 are formed on m-planes, whereby reliability for sufficiently withstanding increase in the laser output and a high-temperature operation can be implemented.

The cavity end faces 21 and 22 are covered with insulating films 23 and 24 (illustration is omitted in FIG. 1) respectively. The cavity end face 21 is a +c-axis side end face, and the cavity end face 22 is a −c-axis side end face. In other words, the crystal plane of the cavity end face 21 is a +c-plane, and the crystal plane of the cavity end face 22 is a −c-plane. The insulating film 24 on the −c-plane side can function as a protective film protecting the chemically weak −c-plane dissolved in alkali, and contributes to improvement in the reliability of the semiconductor laser diode 70.

Figure 4:
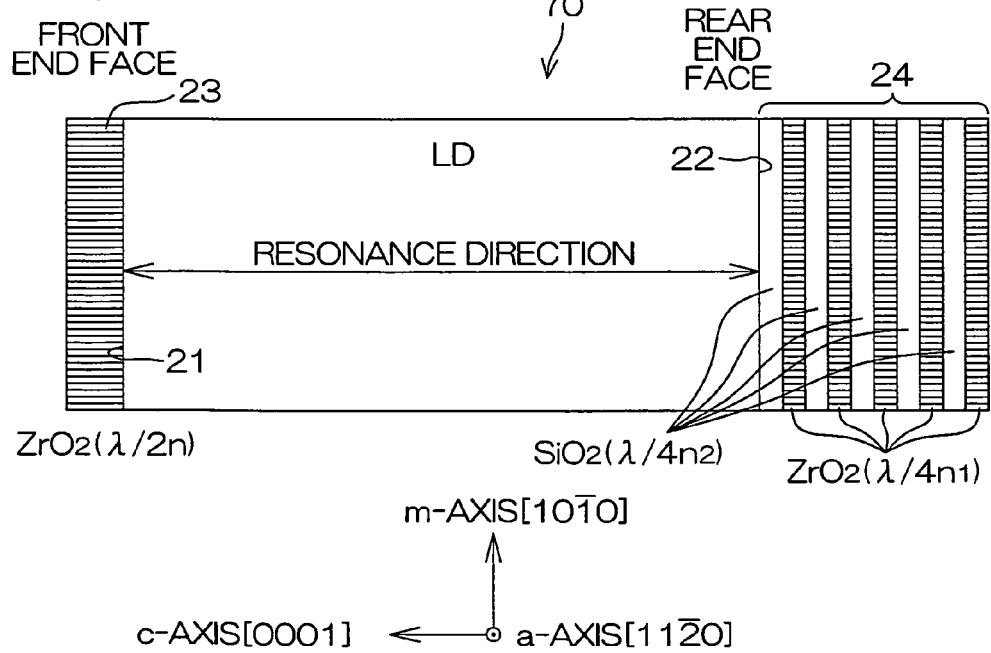
FIG. 4 is a schematic diagram for illustrating the structures of insulating films (reflection films) formed on cavity end faces.

As schematically shown in FIG. 4, the insulating film 23 formed to cover the cavity end face 21 defined by the +c-plane consists of a single film of $ZrO_2$, for example. On the other hand, the insulating film 24 formed on the cavity end face 22 defined by the −c-plane is constituted of a multiple reflection film formed by alternately repetitively stacking $SiO_2$ films and $ZrO_2$ films a plurality of times (five times in the example of FIG. 4), for example. The thickness of the single film of $ZrO_2$ constituting the insulating film 23 is set to $\lambda/2n_1$ (where λ represents the emission wavelength of the light emitting layer 10, and $n_1$ represents the refractive index of $ZrO_2$). On the other hand, the multiple reflection film constituting the insulating film 24 has a structure obtained by alternately stacking $SiO_2$ films each having a thickness $\lambda/4n_2$ (where $n_2$ represents the refractive index of $SiO_2$) and $ZrO_2$ films each having a thickness $\lambda/4n_1$.

According to such a structure, the reflectance on the +c-axis side end face 21 is small, and that on the −c-side end face 22 is large. More specifically, the reflectance of the +c-axis side end face 21 is set to about 20%, and the reflectance on the −c-side end face 22 is about 99.5% (generally 100%), for example. Therefore, it follows that a larger laser output is emitted from the +c-axis side end face 21. In other words, the +c-axis side end face 21 serves as a laser emitting end face in the semiconductor laser diode 70.

According to such a structure, light having a wavelength of 400 nm to 550 nm can be emitted by connecting the n-side electrode 3 and the p-side electrode 4 to a power source and injecting the electrons and the positive holes into the light emitting layer 10 from the n-type semiconductor layer 11 and the p-type semiconductor layer 12 respectively, thereby recombining the electrons and the positive holes in the light emitting layer 10. The light is amplified by induced emission while reciprocating between the cavity end faces 21 and 22 along the guide layers 15 and 17. Then, it follows that a larger quantity of laser output is extracted from the cavity end face 21 serving as the laser emitting end face.

Figure 5:
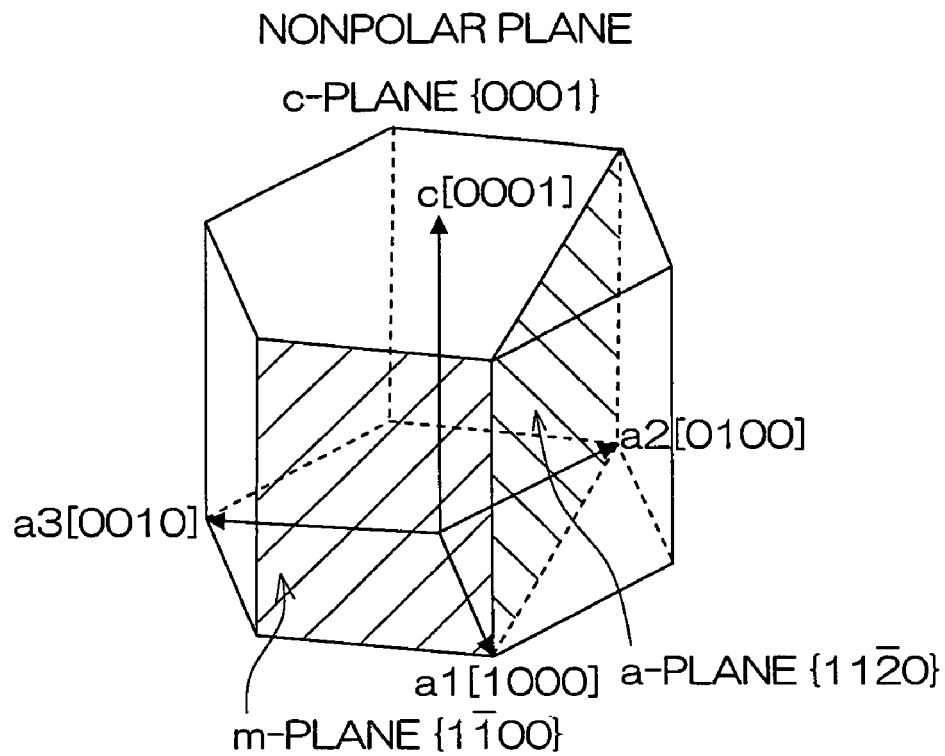
FIG. 5 is a schematic diagram showing a unit cell of the crystal structure of a group III nitride semiconductor.
Figure 5:
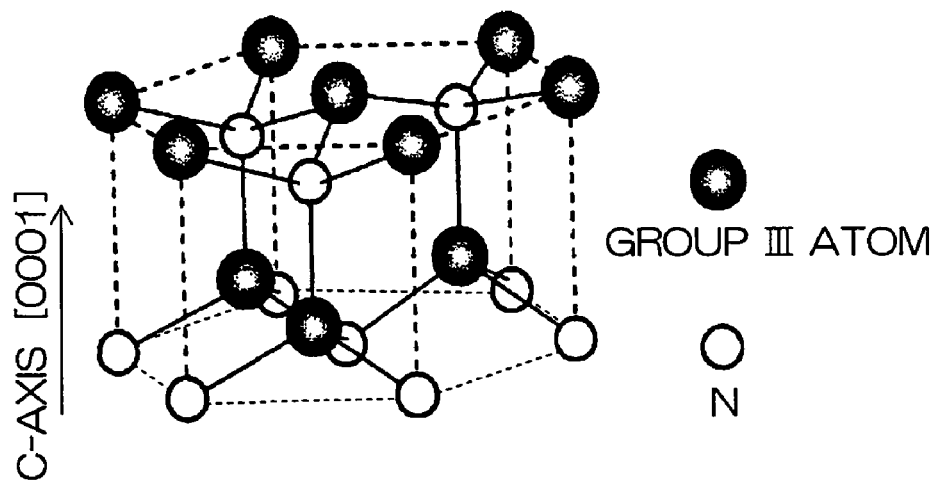

FIG. 5 is a schematic diagram showing a unit cell of the crystal structure of a group III nitride semiconductor. The crystal structure of the group III nitride semiconductor can be approximated by a hexagonal system, and four nitrogen atoms are bonded to one group III atom. The four nitrogen atoms are located on four vertices of a regular tetrahedron having the group III atom disposed at the center thereof. In the four nitrogen atoms, one nitrogen atom is located in a +c-axis direction with respect to the group III atom, while the remaining three nitrogen atoms are located on a −c-axis side with respect to the group III atom. Due to the structure, the direction of polarization is along the c-axis in the group III nitride semiconductor.

The c-axis is along the axial direction of a hexagonal prism, and a surface (the top face of the hexagonal prism) having the c-axis as a normal is a c-plane (0001). When a crystal of the group III nitride semiconductor is cleaved along two surfaces parallel to the c-plane, the surface on the +c-axis side (a +c-plane) is defined by a crystal plane where group III atoms align, and the surface on the −c-axis side (a −c-plane) is defined by a crystal plane (a nitrogen plane) where nitrogen atoms align. Therefore, c-planes, exhibiting different properties on the +c-axis side and the −c-axis side, are referred to as polar planes.

The +c-plane and the −c-plane are different crystal planes, and hence these planes exhibit different physical properties accordingly. More specifically, it has been recognized that the +c-plane has high durability against chemical reactivity such as high resistance against alkali, while the −c-plane is chemically weak and dissolved in alkali, for example.

On the other hand, the side surfaces of the hexagonal prism are defined by m-planes (10-10) respectively, and a surface passing through a pair of unadjacent ridges is defined by an a-plane (11-20). These are crystal planes perpendicular to the c-planes and orthogonal to the direction of polarization, and hence these are planes having no polarity, i.e., nonpolar planes.

For example, a GaN single-crystalline substrate having a major surface defined by an m-plane can be cut out of a GaN single crystal having a major surface defined by a c-plane. The m-plane of the cut substrate is polished by chemical mechanical polishing, for example, so that an azimuth error (an offset angle in a c-axis direction) with respect to a (0001) direction (the c-axis direction) is −1° to 0° (preferably −0.3° to 0°) and an azimuth angle with respect to a (11-20) direction (an a-axis direction) is within ±1° (preferably within ±0.3°. Thus, a GaN single-crystalline substrate having a major surface defined by an m-plane with no crystal defects such as dislocations and stacking faults is obtained. Only steps of an atomic level are formed on the surface of such a GaN single-crystalline substrate.

Particularly in this embodiment, the orientation of the major surface of the GaN single-crystalline substrate is so set that the offset angle θ in the c-axis direction has a negative value in the range of −1°<θ<0 (preferably −0.3°<θ<0).

On the GaN single-crystalline substrate obtained in this manner, the group III nitride semiconductor multilayer structure 2 constituting a semiconductor laser diode structure is grown by metal organic chemical vapor deposition.

When the group III nitride semiconductor multilayer structure 2 having the major growth surface defined by them-plane is grown on the GaN single-crystalline substrate 1 having the major surface defined by the m-plane and a section along an a-plane is observed with an electron microscope (STEM: scanning transmission electron microscope), no striations showing the presence of dislocations are observed in the group III nitride semiconductor multilayer structure 2. When the surface state is observed with an optical microscope, it is understood that planarity in the c-axis direction (the difference between the heights of a highest portion and a lowermost portion) is not more than 10 Å. This means that the planarity of the light emitting layer 10, particularly the quantum well layers, in the c-axis direction is not more than 10 Å, whereby the half band width of an emission spectrum can be reduced. Thus, by using the GaN single-crystalline substrate as the substrate 1, the group III nitride semiconductor multilayer structure 2 can have high crystal quality with a small number of defects. Consequently, a high-performance laser diode can be implemented.

Further, the group III nitride semiconductor multilayer structure is grown on the generally dislocation-free GaN single-crystalline substrate, whereby the group III nitride semiconductor multilayer structure 2 can be formed by excellent crystals having neither stacking faults nor threading dislocations originated from a regrowth surface (m-plane) of the substrate 1. Thus, characteristic deterioration such as reduction in luminous efficiency resulting from defects can be suppressed.

The group III nitride semiconductors crystal-grown on the GaN single-crystalline substrate having the major surface defined by the m-plane grow with major growth surfaces defined by m-planes. If the group III nitride semiconductors are crystal-grown with major surfaces defined by c-planes, the luminous efficiency in the light emitting layer 10 may be deteriorated due to influence by polarization in the c-axis direction. When the major crystal growth surfaces are defined by the m-planes, on the other hand, polarization in the quantum well layers is suppressed, and the luminous efficiency is increased. Thus, reduction of a threshold and increase in slope efficiency can be implemented. Current dependency of the emission wavelength is suppressed due to small polarization, and a stable oscillation wavelength can be implemented.

Further, anisotropy in physical properties is caused in the c-axis direction and the a-axis direction due to the major surfaces defined by m-planes. In addition, biaxial stress resulting from lattice strain is caused in the light emitting layer 10 (active layer) containing In. Consequently, a quantum band structure is different from that of an active layer crystal-grown with major surfaces defined by c-planes. Therefore, a gain different from that in the case of the active layer with the major growth surfaces defined by c-planes is obtained, and laser characteristics are improved.

The major surfaces of crystal growth are so defined by m-planes that group III nitride semiconductor crystals can be extremely stably grown, and crystallinity can be further improved as compared with a case of defining the major crystal growth surfaces by c-planes or a-planes. Thus, a high-performance laser diode can be prepared.

The light emitting layer 10 is formed by group III nitride semiconductors grown with major crystal growth surfaces defined by m-planes, and hence the light emitted therefrom is polarized in the a-axis direction, i.e., the direction parallel to the m-planes, and travels in the c-axis direction in the case of a TE mode. Therefore, the major crystal growth surface of the semiconductor laser diode 70 is parallel to the direction of polarization, and a stripe direction, i.e., the direction of a waveguide is set parallel to the traveling direction of the light. Thus, oscillation of the TE mode can be easily caused, and a threshold current for causing laser oscillation can be reduced.

Figure 6:
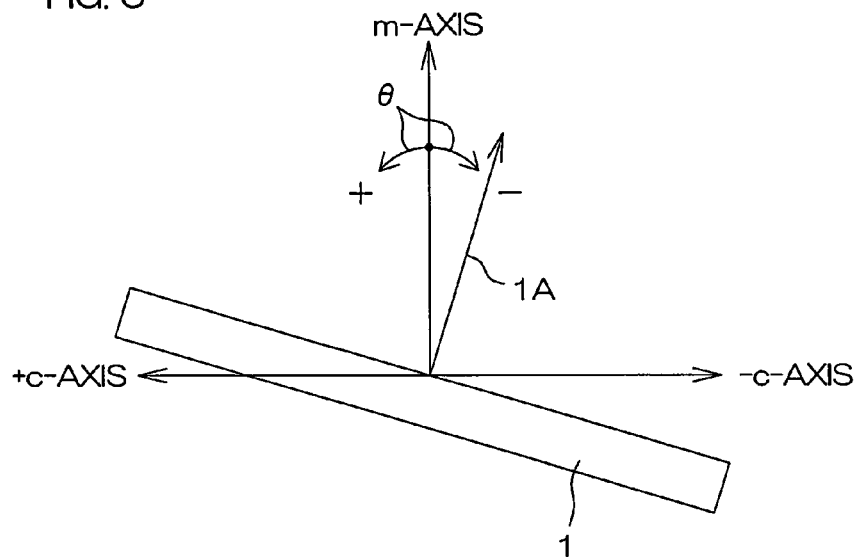
FIG. 6 is a diagram for illustrating an offset angle of a GaN single-crystalline substrate in a c-axis direction.

FIG. 6 is a diagram for illustrating the offset angle θ of the GaN single-crystalline substrate 1 in the c-axis direction. The major surface of the GaN single-crystalline substrate 1 is defined by the m-plane, and the normal direction of the just m-plane matches with the m-axis direction. The m-axis direction is the reference direction. A normal direction 1A of the actual major surface has an offset angle with respect to the reference direction (the m-axis direction). An angle formed by an orthogonal projection of the normal direction 1A on an a-plane (a plane including the c-axis and the m-axis) with respect to the reference direction (the m-axis direction) is the offset angle θ in the c-axis direction. When the orthogonal projection of the normal direction 1A is inclined toward the +c-axis side with respect to the reference direction, the offset angle θ takes a positive value. When the orthogonal projection of the normal direction 1A is contrarily inclined toward the −c-axis side, the offset angle θ takes a negative value. According to this embodiment, the offset angle θ is set to a negative value, as hereinabove described.

Figure 7:
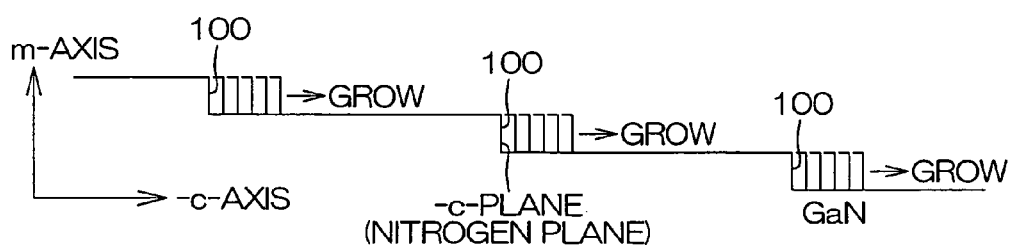
FIG. 7 is a schematic diagram illustrating a state of crystal growth of a group III nitride semiconductor on the GaN single-crystalline substrate.

FIG. 7 is a schematic diagram showing the state of crystal growth of a group III nitride semiconductor on the GaN single-crystalline substrate 1. In FIG. 7, a section along a plane including the c-axis direction and the m-axis direction (i.e., an a-plane) is schematically expressed.

In the major surface of the GaN single-crystalline substrate 1, the offset angle θ in the c-axis direction has a negative value of −1° to 0°. Steps 100 of an atomic level are formed on the surface of the GaN single-crystalline substrate 1. Each step 100 is a surface directed to the −c-axis direction, i.e., a −c-plane (a nitrogen plane). When the group III nitride semiconductor is crystal-grown on such a major surface of the GaN single-crystalline substrate 1, a semiconductor crystal grows in the thickness direction (the m-axis direction) while filmily two-dimensionally growing in the −c-axis direction.

As hereinabove described, the −c-plane is a chemically instable surface, and hence the same easily incorporates impurities in crystal growth. According to this embodiment, In atoms as impurities are incorporated in a large quantity (not less than 15%, for example) under a relatively high-temperature condition (not less than 750° C., for example) through this property, to grow the light emitting layer 10 having the emission wavelength in the long wave range of not less than 450 nm.

Figure 8:
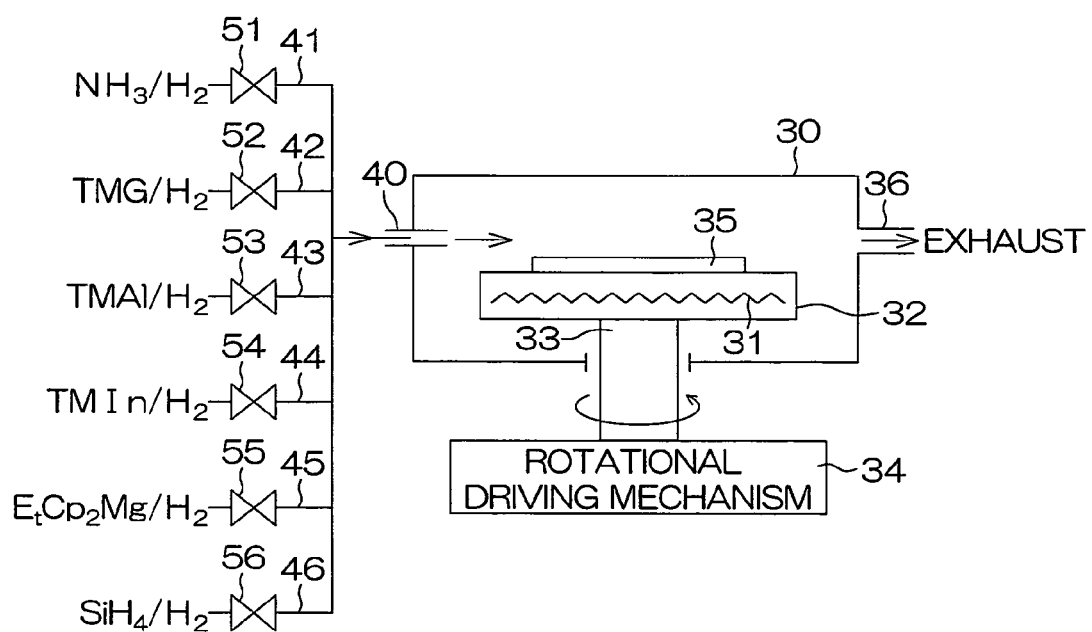
FIG. 8 is a schematic diagram for illustrating the structure of a treating apparatus for growing respective layers constituting a group III nitride semiconductor multilayer structure.

FIG. 8 is a schematic diagram for illustrating the structure of a processing apparatus for growing the layers constituting the group III nitride semiconductor multilayer structure 2. A susceptor 32 storing a heater 31 is arranged in a process chamber 30. The susceptor 32 is coupled to a rotating shaft 33, and the rotating shaft 33 is rotated by a rotational driving mechanism 34 arranged outside the process chamber 30. Thus, the susceptor 32 holds a wafer 35 to be processed, so that the wafer 35 can be heated to a prescribed temperature and rotated in the process chamber 30. The wafer 35 is a GaN single-crystalline wafer constituting the aforementioned GaN single-crystalline substrate 1.

An exhaust pipe 36 is connected to the process chamber 30. The exhaust pipe 36 is connected to exhaust equipment such as a rotary pump. Thus, the pressure in the process chamber 30 is set to 1/10 atm to ordinary pressure, and the atmosphere in the process chamber 30 is regularly exhausted.

On the other hand, a source gas feed passage 40 for feeding source gas toward the surface of the wafer 35 held by the susceptor 32 is introduced into the process chamber 30. A nitrogen material pipe 41 feeding ammonia as nitrogen source gas, a gallium material pipe 42 feeding trimethyl gallium (TMG) as gallium source gas, an aluminum material pipe 43 feeding trimethyl aluminum (TMAl) as aluminum source gas, an indium material pipe 44 feeding trimethyl indium (TMIn) as indium source gas, a magnesium material pipe 45 feeding ethylcyclopentadienyl magnesium ($EtCp_2Mg$) as magnesium source gas and a silicon material pipe 46 feeding silane ($SiH_4$) as source gas of silicon are connected to the source gas feed passage 40. Valves 51 to 56 are interposed in the material pipes 41 to 46 respectively. Each source gas is fed along with carrier gas including hydrogen and/or nitrogen.

For example, a GaN single-crystalline wafer having a major surface defined by an m-plane is held by the susceptor 32 as the wafer 35. In this state, the nitrogen material valve 51 is opened while the valves 52 to 56 are kept closed, so that the carrier gas and ammonia gas (nitrogen source gas) are fed into the process chamber 30. Further, the heater 31 is electrified, and the wafer temperature is increased to 1000° C. to 1100° C. (1050° C., for example). Thus, GaN semiconductors can be grown without roughening the surface.

After waiting until the wafer temperature reaches 1000° C. to 1100° C., the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type GaN contact layer 13 made of a GaN layer doped with silicon grows on the surface of the wafer 35.

Then, the aluminum material valve 53 is opened, in addition to the nitrogen material valve 51, the gallium material valve 52 and the silicon material valve 56. Thus, ammonia, trimethyl gallium, silane and trimethyl aluminum are fed from the source gas feed passage 40 along with the carrier gas. Consequently, the n-type AlGaN cladding layer 14 is epitaxially grown on the n-type GaN contact layer 13.

Then, the aluminum material valve 53 is closed, and the nitrogen material valve 51, the gallium material valve 52 and the silicon material valve 56 are opened. Thus, ammonia, trimethyl gallium and silane are fed from the source gas feed passage 40 along with the carrier gas. Consequently, the n-type guide layer is epitaxially grown on the n-type AlGaN cladding layer 14.

Then, the silicon material valve 56 is closed, and growth of the light emitting layer 10 (the active layer) having the multiple quantum well structure is performed. The light emitting layer 10 can be grown by alternately carrying out a step of growing an InGaN layer by opening the nitrogen material valve 51, the gallium material valve 52 and the indium material valve 54 for feeding ammonia, trimethyl gallium and trimethyl indium to the wafer 35 and a step of growing an additive-free GaN layer by closing the indium material valve 54 and opening the nitrogen material valve 51 and the gallium material valve 52 for feeding ammonia and trimethyl gallium to the wafer 35. For example, a GaN layer is formed at first, and an InGaN layer is formed thereon. The operation is repetitively performed over five times, for example. In the formation of the light emitting layer 10, the temperature of the wafer 35 is preferably set to 750° C. to 800° C., for example. At this time, the growth pressure is preferably set to not less than 700 torr, whereby heat resistance can be improved.

As hereinabove described, the crystal growth filmily progresses in the −c-axis direction, and In atoms as impurities are easily incorporated in the growth of the InGaN layer as a quantum well layer. Therefore, a relatively high-temperature condition (not less than 750° C.) can be employed when forming the InGaN layer. An InGaN layer having a high In composition can be formed also under such a high-temperature condition. For example, a temperature condition of about 780° C. can be employed also in a case of setting the In composition to not less than 15% (20%, for example) in order to implement an emission wavelength of not more than 450 nm (500 nm, for example). Further, the InGaN layer can be grown at a higher temperature also in a case of setting the emission wavelength to 450 nm.

After the light emitting layer 10 is formed in this manner, the p-type electron blocking layer 16 is thereafter formed. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed toward the wafer 35, and it follows that the p-type electron blocking layer 16 made of an AlGaN layer doped with magnesium is formed. In the formation of the p-type electron blocking layer 16, the temperature of the wafer 35 is preferably set to 1000° C. to 1100° C. (1000° C., for example).

Then, the aluminum material valve 53 is closed, and the nitrogen material valve 51, the gallium material valve 52 and the magnesium material valve 55 are opened. Thus, ammonia, trimethyl gallium and ethylcyclopentadienyl magnesium are fed toward the wafer 35, and it follows that the guide layer 17 made of a p-type GaN layer doped with magnesium is formed. In the formation of the p-type GaN guide layer 17, the temperature of the wafer 35 is preferably set to 900° C. to 1100° C. (1000° C., for example).

Then, the aluminum material valve 53 is opened again. In other words, the nitrogen material valve 51, the gallium material valve 52, the aluminum material valve 53 and the magnesium material valve 55 are opened, and the remaining valves 54 and 56 are closed. Thus, ammonia, trimethyl gallium, trimethyl aluminum and ethylcyclopentadienyl magnesium are fed toward the wafer 35, and it follows that the cladding layer 18 made of an AlGaN layer doped with magnesium to be of the p-type is formed. In the formation of the p-type AlGaN cladding layer 18, the temperature of the wafer 35 is preferably set to 900° C. to 1100° C. (1000° C., for example).

Then, the p-type contact layer 19 is formed. In other words, the nitrogen material valve 51, the gallium material valve 52 and the magnesium material valve 55 are opened, and the remaining valves 53, 54 and 56 are closed. Thus, ammonia, trimethyl gallium and ethylcyclopentadienyl magnesium are fed toward the wafer 35, and it follows that the p-type GaN contact layer 19 made of a GaN layer doped with magnesium is formed. In the formation of the p-type GaN contact layer 19, the temperature of the wafer 35 is preferably set to 900° C. to 1100° C. (1000° C., for example).

The layers forming the p-type semiconductor layer 12 are preferably crystal-grown at an average growth temperature of not more than 1000° C. Thus, thermal damage on the light emitting layer 10 can be reduced.

When the layers 10 and 13 to 19 forming the group III nitride semiconductor multilayer structure 2 are grown on the wafer 35 (the GaN single-crystalline substrate 1), a V/III ratio indicating the ratio of the molar fraction of the nitrogen material (ammonia) to the molar fraction of the gallium material (trimethyl gallium) fed to the wafer 35 in the process chamber 30 is maintained at a high value of not less than 1000 (preferably not less than 3000) in the growth of each layer. More specifically, the average of the V/III ratios is preferably not less than 1000 from the n-type cladding layer 14 up to the uppermost p-type contact layer 19. Thus, excellent crystals having small numbers of point defects can be obtained in all of the n-type cladding layer 14, the light emitting layer 10 and the p-type cladding layer 18.

According to this embodiment, the aforementioned high V/III ratio is employed, and the group III nitride semiconductor multilayer structure 2 having the major surface defined by an m-plane or the like is grown in a dislocation-free state in a planar manner without interposing a buffer layer between the GaN single-crystalline substrate 1 and the group III nitride semiconductor multilayer structure 2. The group III nitride semiconductor multilayer structure 2 has neither stacking faults nor threading dislocations formed from the major surface of the GaN single-crystalline substrate 1.

When the group III nitride semiconductor multilayer structure 2 is grown on the wafer 35 in this manner, the wafer 35 is transferred to an etching apparatus, and the ridge stripe 20 is formed by partially removing the p-type semiconductor layer 12 by dry etching such as plasma etching, for example. The ridge stripe 20 is formed to be parallel to the c-axis direction.

After the formation of the ridge stripe 20, the insulating layer 6 is formed. The insulating layer 6 is formed through a lift-off process, for example. In other words, the insulating layer 6 can be formed by forming a striped mask, thereafter forming an insulator thin film to entirely cover the p-type AlGaN cladding layer 18 and the p-type GaN contact layer 19, and thereafter lifting off the insulator thin film to expose the p-type GaN contact layer 19.

Then, the p-side electrode 4 in ohmic contact with the p-type GaN contact layer 19 is formed, and the n-side electrode 3 in ohmic contact with the substrate 1 is formed. The electrodes 3 and 4 can be formed by resistance heating or in a metal vapor deposition apparatus employing an electron beam, for example.

The next step is division into each individual element. In other words, each element forming the semiconductor laser diode is cut out by cleaving the wafer 35 in a direction parallel to the ridge stripe 20 and a direction perpendicular thereto. The wafer 35 is cleaved in the direction parallel to the ridge stripe along the a-plane. Further, the wafer 35 is cleaved in the direction perpendicular to the ridge stripe 20 along the c-plane. Thus, the cavity end face 21 defined by the +c-plane and the cavity end face 22 defined by the −c-plane are formed.

Then, the aforementioned insulating films 23 and 24 are formed on the cavity end faces 21 and 22 respectively. The insulating films 23 and 24 can be formed by electron cyclotron resonance (ECR) film formation, for example.

According to the embodiment, as hereinabove described, the GaN single-crystalline substrate 1 having the major surface defined by the m-plane whose offset angle θ in the c-axis direction has a negative value in the range of −1°<θ<0°, and the group III nitride semiconductor multilayer structure is crystal-grown on the major surface of the GaN single-crystalline substrate 1. Thus, InGaN layers each having a high In composition can be formed under a relatively high-temperature condition in the formation of the light emitting layer 10. Therefore, the light emitting layer 10 has excellent durability against thermal damage. Therefore, characteristic deterioration in the formation of the p-type semiconductor layer 12 after the formation of the light emitting layer 10 can be suppressed. Thus, a nitride semiconductor light-emitting element having high luminous efficiency can be obtained. In particular, excellent luminous efficiency can be implemented when increasing the wavelength (not less than 450 nm) by increasing the In composition in the light emitting layer 10.

Figure 9:
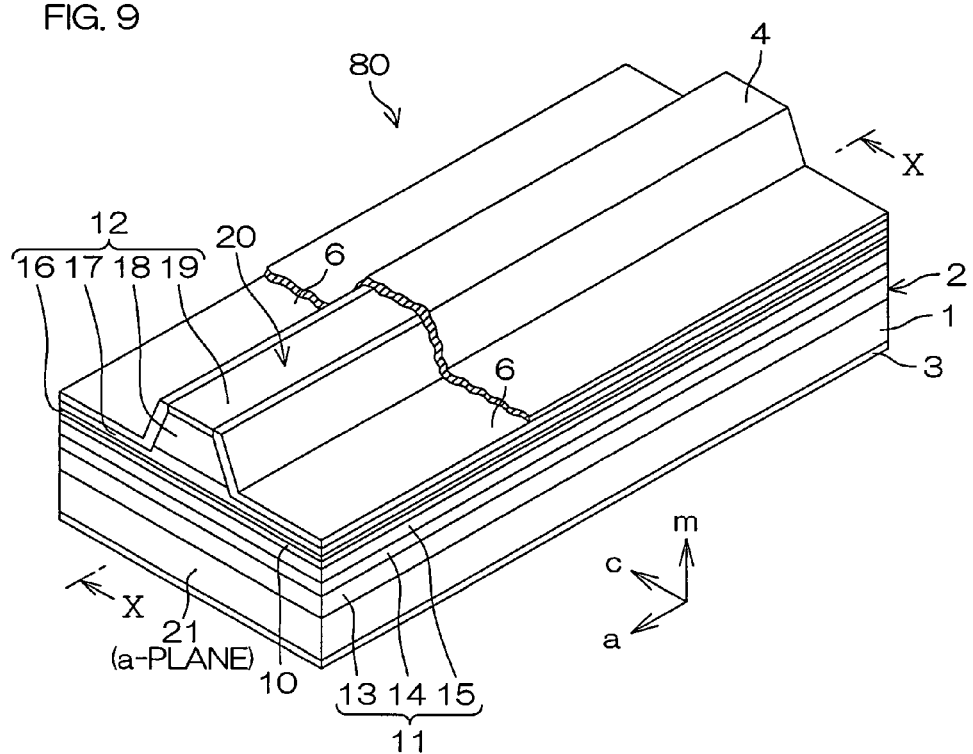
FIG. 9 is a perspective view showing the structure of a semiconductor laser diode according to a second embodiment of the present invention.
Figure 10:
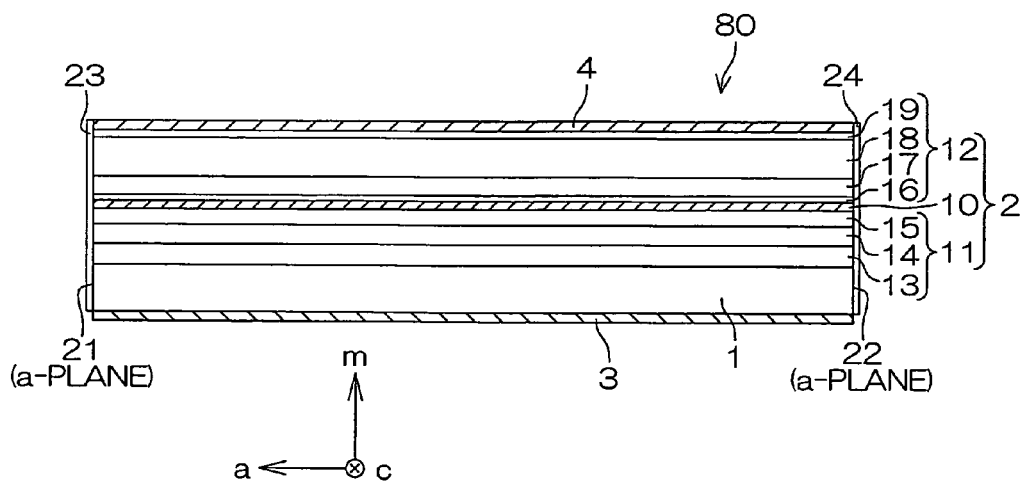
FIG. 10 is a longitudinal sectional view along a line X-X in FIG. 9.

FIG. 9 is a perspective view showing the structure of a semiconductor laser diode according to a second embodiment of the present invention, and FIG. 10 is a longitudinal sectional view along a line X-X in FIG. 9. Referring to FIGS. 9 and 10, portions corresponding to the respective portions shown in the aforementioned FIGS. 1 to 3 are denoted by the same reference numerals.

In a semiconductor laser diode 80 according to this embodiment, a ridge stripe 20 is formed parallelly to an a-axis direction, and hence both of cavity end faces 21 and 22 are defined by a-planes. The cavity end faces 21 and 22 are also defined by cleavage planes formed by cleavage.

Stacking faults resulting from epitaxy of a group III nitride semiconductor multilayer structure 2 are formed parallelly to a c-plane. In the structure of the aforementioned first embodiment, therefore, it follows that stacking faults and the waveguide intersect with one another. According to this embodiment, on the other hand, a stripe direction is rendered parallelized to an a-axis, and hence a waveguide is parallel to the a-axis. The a-axis is parallel to a c-plane, whereby stacking faults formed parallelly to the c-plane do not intersect with the waveguide. Thus, disturbance of a light guide and increase in a leakage current resulting from stacking faults can be avoided.

Figure 11:
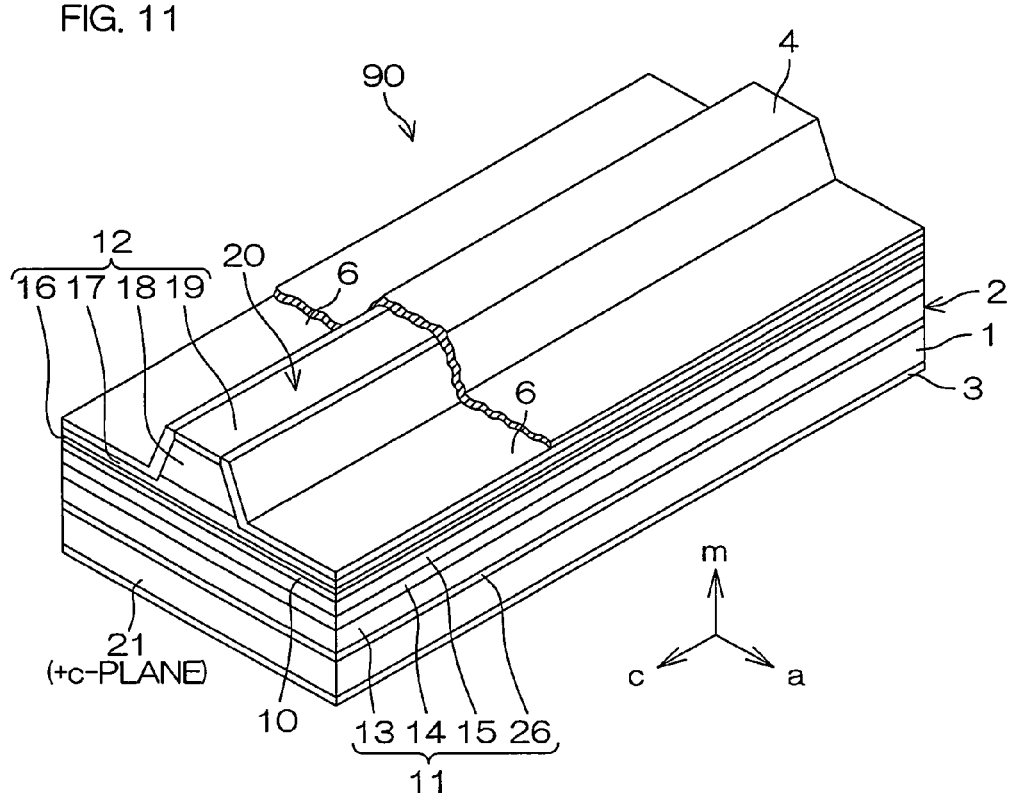
FIG. 11 is a perspective view for illustrating the structure of a semiconductor laser diode according to a third embodiment of the present invention.

FIG. 11 is a perspective view for illustrating the structure of a semiconductor laser diode according to a third embodiment of the present invention. Referring to FIG. 11, portions corresponding to the respective portions shown in the aforementioned FIG. 1 are denoted by the same reference numerals.

In a semiconductor laser diode 90 according to this embodiment, a layer containing In including biaxial stress, i.e., an n-type InGaN Layer 26 (having a thickness of 0.1 μm, for example: the n-type impurity concentration is $1\times10^{18}$ cm$^{-3}$) is interposed between a substrate 1 and an n-type GaN contact layer 13 in a group III nitride semiconductor multilayer structure 2. The n-type InGaN layer 26 is provided so that the group III nitride semiconductor multilayer structure 2 can be inhibited from formation of cracks parallel to a c-plane due to the biaxial stress thereof.

When the substrate 1 is formed by a GaN single-crystalline substrate 1 having a major surface defined by an m-plane and the group III nitride semiconductor multilayer structure 2 is grown thereon, the major growth surfaces thereof are defined by m-planes, and the n-type InGaN layer 26 also grows with a major growth surface defined by an m-plane, as a matter of course. Thus, it follows that the n-type GaN layer 26 has biaxial stress.

While three embodiments of the present invention have been described, the present invention may be embodied in other ways.

For example, while the example of employing the group III nitride semiconductor multilayer structure 2 having the major surface defined by the m-plane whose offset angle θ in the c-axis direction is in the range of −1°<θ<0 has been described in each of the aforementioned embodiments, the group III nitride semiconductor multilayer structure 2 may be formed by group III nitride semiconductors each having a major surface defined by an a-plane which is another nonpolar plane. In this case, the group III nitride semiconductor multilayer structure 2 may be constituted of group III nitride semiconductors each having a major surface defined by an a-plane whose offset angle θ in the c-axis direction has a negative value in the range of −1°<θ<0. Such a group III nitride semiconductor multilayer structure 2 can be formed on a GaN semiconductor single-crystalline substrate having a major surface defined by an a-plane whose offset angle θ in the c-axis direction has a negative value in the range of −1°<θ<0.

Further, the thicknesses of and the impurity concentrations in the layers forming the group III nitride semiconductor multilayer structure 2 are merely examples, and appropriate values can be properly selected and employed. The cladding layers 14 and 18 may not be single layers of AlGaN, but the cladding layers can also be formed of super lattices constituted of AlGaN sensitive layers and GaN layers.

The substrate 1 may be removed by laser lift off or the like after the group III nitride semiconductor multilayer structure 2 is formed, so that the semiconductor laser diode has no substrate 1.

In addition, while each of the aforementioned embodiments has been described with reference to the semiconductor laser diode, the present invention is also applicable to a semiconductor light-emitting element of another structure such as a light-emitting diode, as a matter of course, and the luminous efficiency thereof can be improved.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-153045 filed with the Japan Patent Office on Jun. 8, 2007, the disclosure of which is incorporated herein by reference.

The invention claimed is:

1. A semiconductor light-emitting element comprising a group III nitride semiconductor multilayer structure having an active layer containing In as well as a p-type layer and an n-type layer stacked to hold the active layer therebetween, wherein
    the group III nitride semiconductor multilayer structure is made of a group III nitride semiconductor having a major surface defined by a nonpolar plane whose offset angle in a c-axis direction is negative.

2. The semiconductor light-emitting element according to claim 1, wherein
    an emission wavelength of the active layer is not less than 450 nm.

3. The semiconductor light-emitting element according to claim 1 or 2, wherein
    the offset angle θ in the c-axis direction satisfies −1°<θ<0° in the group III nitride semiconductor forming the group III nitride semiconductor multilayer structure.

4. A method of fabricating a semiconductor light-emitting element comprising a group III nitride semiconductor multilayer structure having an active layer containing In as well as a p-type layer and an n-type layer stacked to hold the active layer therebetween, the method comprising:

a step of forming the group III nitride semiconductor multilayer structure by growing a group III nitride semiconductor with a major surface defined by a nonpolar plane whose offset angle in a c-axis direction is negative.

5. The method of fabricating a semiconductor light-emitting element according to claim 4, wherein an emission wavelength of the active layer is not less than 450 nm.

6. The method of fabricating a semiconductor light-emitting element according to claim 4 or 5, wherein the major surface is defined by an m-plane whose offset angle in the c-axis direction is negative.

7. The method of fabricating a semiconductor light-emitting element according to any one of claims 4 to 6, wherein the step of forming the group III nitride semiconductor multilayer structure includes a step of growing a group III nitride semiconductor having a major surface defined by a nonpolar plane whose offset angle $\theta$ in the c-axis direction satisfies $-1° < \theta < 0°$.

8. The method of fabricating a semiconductor light-emitting element according to any one of claims 4 to 7, wherein the step of forming the group III nitride semiconductor multilayer structure includes a step of growing the group III nitride semiconductor on a group III nitride semiconductor single-crystalline substrate having a major surface whose offset angle in the c-axis direction is negative.

9. The method of fabricating a semiconductor light-emitting element according to claim 8, wherein the group III nitride semiconductor single-crystalline substrate is a GaN substrate.

\* \* \* \* \*